(12) United States Patent
Song et al.

(10) Patent No.: US 11,870,015 B2
(45) Date of Patent: Jan. 9, 2024

(54) LIGHT CONVERSION DEVICES INCORPORATING QUANTUM DOTS

(71) Applicant: Saphlux, Inc., Branford, CT (US)

(72) Inventors: Jie Song, Branford, CT (US); Chen Chen, Branford, CT (US)

(73) Assignee: Saphlux, Inc., Branford, CT (US)

( * ) Notice: Subject to any disclaimer, the term of this patent is extended or adjusted under 35 U.S.C. 154(b) by 0 days.

(21) Appl. No.: 16/816,136

(22) Filed: Mar. 11, 2020

(65) Prior Publication Data

US 2020/0295239 A1 Sep. 17, 2020

Related U.S. Application Data

(60) Provisional application No. 62/964,101, filed on Jan. 21, 2020, provisional application No. 62/816,595, filed on Mar. 11, 2019.

(51) Int. Cl.
*H01L 33/50* (2010.01)

(52) U.S. Cl.
CPC .... *H01L 33/504* (2013.01); *H01L 2933/0041* (2013.01)

(58) Field of Classification Search
CPC .................................................. H01L 33/504
See application file for complete search history.

(56) References Cited

U.S. PATENT DOCUMENTS 8,941,293 B2 1/2015 Cheon et al.
10,459,284 B1* 10/2019 Kuo .................. G02F 1/133617
10,622,498 B2* 4/2020 Wang ................. H01L 31/1808
2013/0240348 A1* 9/2013 Mi ...................... H01L 21/0262
204/157.5

(Continued)

FOREIGN PATENT DOCUMENTS

CN 113540324 B * 9/2022

OTHER PUBLICATIONS

Super-Hydrophobic Cesium Lead Halide Perovskite Quantum Dot-Polymer Composites with High Stability and Luminescent Efficiency for Wide Color Gamut White Light-Emitting Diodes (Year: 2019).*

(Continued)

*Primary Examiner* — Sarah K Salerno
(74) *Attorney, Agent, or Firm* — JAFFERY WATSON MENDONSA & HAMILTON LLP (57) ABSTRACT

Aspects of the disclosure provide for light conversion devices incorporating quantum dots and methods of fabricating the same. In accordance with some embodiments of the present disclosure, a light conversion device is provided. The light conversion device may include. a porous structure comprising one or more nanoporous materials, wherein the one or more nanoporous materials comprise a plurality of pores; and a plurality of quantum dots placed in the porous structure, wherein the plurality of quantum dots comprises a first plurality of quantum dots configured to convert light of a first color into light of a second color, and a second plurality of quantum dots configured to convert the light of the first color into light of a third color. Each of the plurality of pores may have a nanoscale size. The nonporous materials may further include a matrix comprising a semiconductor material, glass, plastic, metal, polymer, etc.

19 Claims, 4 Drawing Sheets

(56) References Cited

U.S. PATENT DOCUMENTS

| | | | |
|---|---|---|---|
| 2014/0340912 A1* | 11/2014 | Kang | F21V 9/00 |
| | | | 362/351 |
| 2015/0053916 A1* | 2/2015 | Pickett | H01L 33/30 |
| | | | 438/47 |
| 2017/0158959 A1 | 6/2017 | Pickett et al. | |
| 2017/0170152 A1 | 6/2017 | Wi | |
| 2018/0011231 A1 | 1/2018 | Jiang et al. | |
| 2018/0350871 A1 | 12/2018 | Lee et al. | |
| 2019/0086733 A1 | 3/2019 | Min et al. | |
| 2020/0048545 A1* | 2/2020 | Kalisman | H01L 33/505 |
| 2020/0051959 A1 | 2/2020 | Pschenitzka | |
| 2020/0152694 A1 | 5/2020 | Lee | |
| 2020/0152841 A1 | 5/2020 | Han | |
| 2020/0168771 A1* | 5/2020 | Anc | H01L 33/0066 |
| 2020/0287102 A1* | 9/2020 | Bertram | C09K 11/08 |
| 2022/0231203 A1 | 7/2022 | Song et al. | |

OTHER PUBLICATIONS

PCT International Search Report for PCT/US2021/014402, dated Apr. 8, 2021, 2 pages.
PCT Written Opinion of the International Searching Authority for PCT/US2021/014402, dated Apr. 8, 2021, 5 pages.

* cited by examiner

```
┌─────────────────────────────────────────────────────────────┐
│ PROVIDING A POROUS STRUCTURE COMPRISING ONE OR MORE         │
│ NANOPOROUS MATERIAL, WHEREIN THE NANOPOROUS MATERIAL        │
│ COMPRISES A MATRIX STRUCTURE AND A PLURALITY OF PORES 310   │
└─────────────────────────────────────────────────────────────┘
                              ↓
┌─────────────────────────────────────────────────────────────┐
│  ┌───────────────────────────────────────────────────────┐  │
│  │ PLACING A FIRST PLURALITY OF QUANTUM DOTS INTO A      │  │
│  │ FIRST PORTION OF THE POROUS STRUCTURE, WHEREIN        │  │
│  │ THE FIRST PLURALITY OF QUANTUM DOTS IS CONFIGURED     │  │
│  │ TO CONVERT LIGHT OF A FIRST COLOR INTO LIGHT OF A     │  │
│  │ SECOND COLOR 321                                      │  │
│  └───────────────────────────────────────────────────────┘  │
│                              ↓                              │
│  ┌───────────────────────────────────────────────────────┐  │
│  │ PLACING A SECOND PLURALITY OF QUANTUM DOTS INTO A     │  │
│  │ SECOND PORTION OF THE POROUS STRUCTURE, WHEREIN       │  │
│  │ THE SECOND PLURALITY OF QUANTUM DOTS IS               │  │
│  │ CONFIGURED TO CONVERT THE LIGHT OF THE FIRST          │  │
│  │ COLOR INTO LIGHT OF A THIRD COLOR 323                 │  │
│  └───────────────────────────────────────────────────────┘  │
│                              ↓                              │
│  ┌───────────────────────────────────────────────────────┐  │
│  │ PLACING A THIRD PLURALITY OF QUANTUM DOTS INTO A      │  │
│  │ THIRD PORTION OF THE POROUS STRUCTURE, WHEREIN        │  │
│  │ THE THIRD PLURALITY OF QUANTUM DOTS IS CONFIGURED     │  │
│  │ TO CONVERT THE LIGHT OF THE FIRST COLOR INTO LIGHT    │  │
│  │ OF A FOURTH COLOR 325                                 │  │
│  └───────────────────────────────────────────────────────┘  │
│   PLACING A PLURALITY OF QUANTUM DOTS IN THE POROUS         │
│                       STRUCTURE 320                         │
└─────────────────────────────────────────────────────────────┘
```

FIG. 3

LIGHT CONVERSION DEVICES INCORPORATING QUANTUM DOTS

CROSS-REFERENCE TO RELATED APPLICATIONS

This application claims the benefits of U.S. Patent Application No. 62/816,595, filed Mar. 11, 2019, and U.S. Patent Application No. 62/964,101, filed Jan. 21, 2020, each of which is incorporated herein in its entirety.

TECHNICAL FIELD

The implementations of the disclosure relate generally to semiconductor devices and, more specifically, to light conversion devices incorporating quantum dots (QDs) and methods of fabricating the same.

BACKGROUND

Quantum dots (QDs) are semiconductor particles in nanoscale sizes. When a QD is illuminated by light, an electron in the QD may be excited to a state of higher energy. The QD may thus emit light of a certain wavelength. QDs of various shapes, sizes, compositions, etc. may emit light with various wavelengths. For example, a relatively larger QD may emit light with a relatively longer wavelength, while a relatively smaller QD may emit light with a relatively shorter wavelength.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In accordance with one or more aspects of the present disclosure, a light conversion device is provided. The light conversion device may include a porous structure that may include one or more nanoporous materials. In some embodiments, the one or more nanoporous materials may include a plurality of pores. The light conversion device may also include a plurality of quantum dots placed in the porous structure. In some embodiments, the plurality of quantum dots may include a first plurality of quantum dots configured to convert light of a first color into light of a second color, and a second plurality of quantum dots configured to convert the light of the first color into light of a third color.

In some embodiments, each of the plurality of pores has a nanoscale size.

In some embodiments, the one or more nonporous materials may further include a matrix that may include at least one of a semiconductor material, glass, plastic, metal, or polymer. In some embodiments, the semiconductor material may include at least one of Si, AlN, InGaN, or AlGaN.

In some embodiments, the light-conversion device may further include a light source configured to produce the light of the first color.

In some embodiments, the light of the first color may include violet light.

In some embodiments, the second color may include a green color and the third color may include a red color.

In some embodiments, the plurality of quantum dots may further include a third plurality of quantum dots configured to convert the light of the first color to light of a fourth color. The fourth color may include a blue color.

In some embodiments, the first plurality of quantum dots, the second plurality of quantum dots, and the third plurality of quantum dots may be placed in a first portion of the porous structure, a second portion of the porous structure, and a third portion of the porous structure, respectively.

In accordance with one or more aspects of the present disclosure, a method for fabricating a light conversion device is provided. The method may include providing a porous structure that may include one or more nanoporous materials. The one or more nanoporous materials may include a plurality of pores. The method may also include placing a plurality of quantum dots in the porous structure. The plurality of quantum dots may include a first plurality of quantum dots configured to convert light of a first color into light of a second color, and a second plurality of quantum dots configured to convert the light of the first color into light of a third color.

In some embodiments, providing the porous structure may include forming the one or more nanoporous materials using a solid material. The solid material may include at least one of a semiconductor material, glass, plastic, metal, or polymer in some embodiments. The semiconductor material may include at least one of Si, AlN, InGaN, or AlGaN in some embodiments.

In some embodiments, forming the one or more nanoporous materials using the solid material may include etching the solid material to form the plurality of pores. In some embodiments, placing the plurality of quantum dots in the porous structure may include placing the first plurality of quantum dots in a first portion of the porous structure, placing the second plurality of quantum dots in a second portion of the porous structure, and placing the third plurality of quantum dots in a third portion of the porous structure.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the disclosure provide for light conversion devices incorporating quantum dots (QDs) and methods of fabricating the same. In accordance with one or more aspects of the present disclosure, a light conversion device may include a nanoporous structure comprising one or more nanoporous materials. The nanoporous materials may include pores (e.g., voids) of nanoscale sizes (e.g., a size of the order of 1 nm to 1000 nm or larger). The light conversion device may further include quantum dots placed in the nanoporous structure (e.g., the pores in the nanoporous structure). The quantum dots may convert input light into light of various colors. For example, the quantum dots in the light conversion device may include one or more first quantum dots for converting the input light into green light, one or more second quantum dots for converting the input light into red light, one or more third quantum dots for converting the input light into blue light, etc.

In accordance with one or more aspects of the present disclosure, methods for fabricating the light conversion device are provided. The methods may include fabricating the nanoporous structure using a solid material. For example, the nanoporous materials may be formed by etching the solid material. Examples of the solid materials may include semiconductor materials (Si, GaN, AlN, InGaN, AlGaN, etc.), glass, plastic, metal, polymer, etc. The methods may further include placing the quantum dots in the nanoporous structure. For example, the quantum dots may be loaded into one or more of the pores in the nanoporous structure.

The nanoporous structure described herein may work as a great natural receptacle for quantum dot loading and may thus enable easy manufacturing of the light-conversion device. For example, the light-conversion device may be fabricated using a photolithography method, an inkjet printing method, etc. The porous structure may also increase internal scattering and effective pathways of light traveling in the light-conversion device. The porous structure may thus improve the light conversion efficiency of the loaded QDs.

Examples of embodiments of the present disclosure will be described in more detail with reference to the accompanying drawings. It should be understood that the following embodiments are given by way of illustration only to provide thorough understanding of the disclosure to those skilled in the art. Therefore, the present disclosure is not limited to the following embodiments and may be embodied in different ways. Further, it should be noted that the drawings are not to precise scale and some of the dimensions, such as width, length, thickness, and the like, can be exaggerated for clarity of description in the drawings. Like components are denoted by like reference numerals throughout the specification.

Figure 1A:
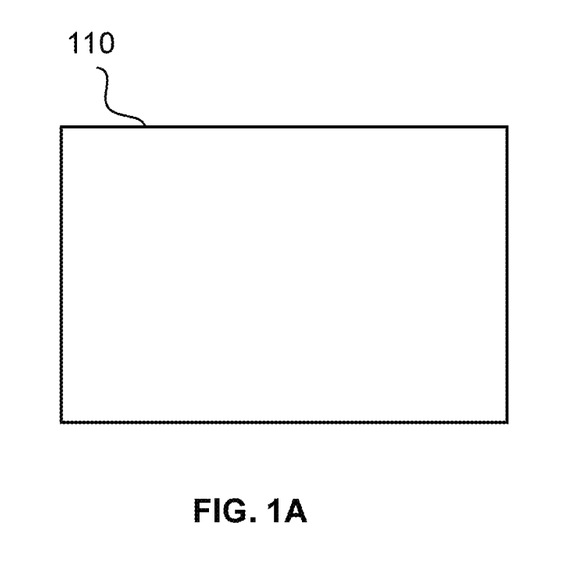
FIGS. 1A, 1B, and 1C are block diagrams illustrating structures associated with an example process for fabricating a light conversion device in accordance with some embodiments of the present disclosure.
Figure 1B:
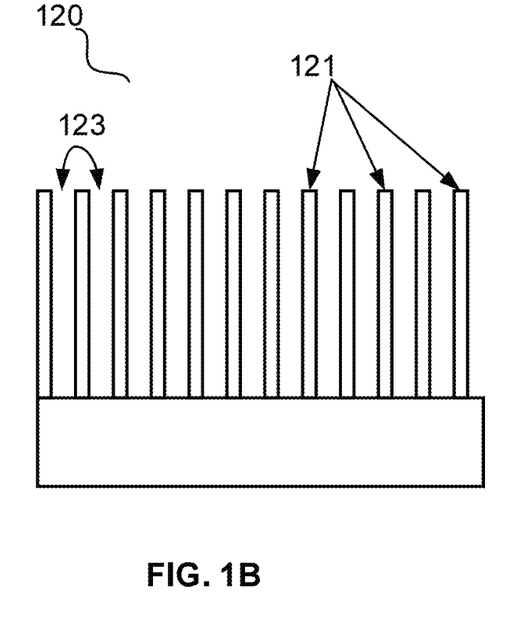
Figure 1C:
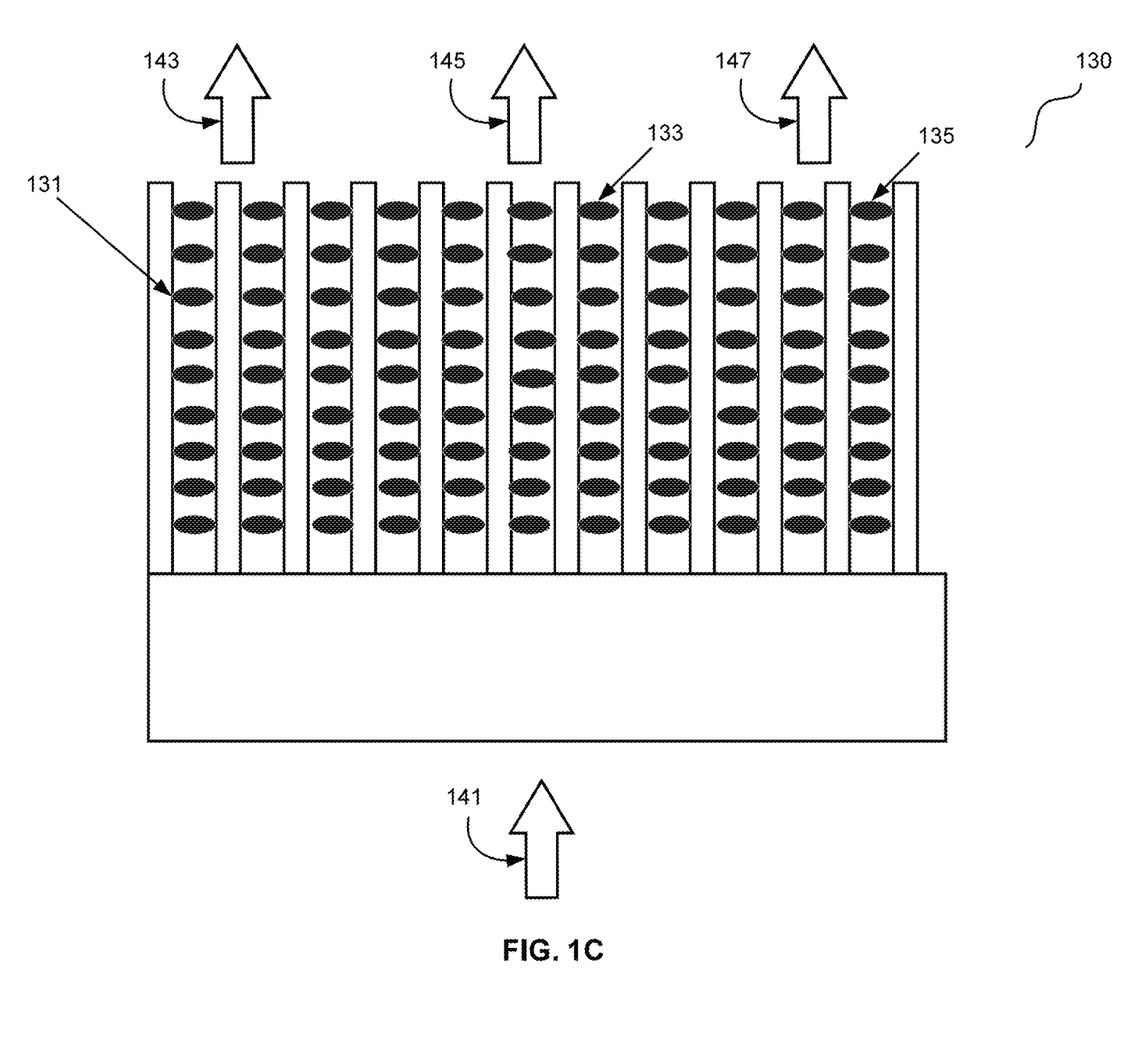

Referring to FIGS. 1A, 1B, and 1C, structures related to an example process for fabricating a light conversion device in accordance with some embodiments of the present disclosure are illustrated. As shown in FIG. 1A, a solid material 110 may be obtained for fabricating a light conversion device in accordance with the present disclosure. The solid material 110 may be fabricated into a porous structure comprising nanoporous materials (also referred to herein as the "nanoporous structure").

For example, as illustrated in FIG. 1B, the solid material 110 may be fabricated into a porous structure 120. In some embodiments, the porous structure 120 may be fabricated by etching the solid material 110 using chemical etching and/or any other suitable etching technique. The porous structure 120 may include nanoporous materials comprising pores. As shown in FIG. 1B, the porous structure 120 may include a matrix structure 121 comprising the solid material and pores 123. Each of the pores 123 may have a nanoscale size (e.g., a size of the order of 1 nm to 1000 nm or larger). The porosity of the porous structure 120 and/or the nanomaterials (e.g., a fraction of the volume of the pores 123 over a total volume of the porous structure 120) can be in a range of 10% to 90%. In some embodiments, a diameter of a pore 123 may be equal to or greater than 10 nm. The pores 123 may be dispersed in a three-dimensional space.

As illustrated in FIG. 1C, one or more quantum dots (QDs) may be placed into the porous structure 120 to fabricate a light conversion device 130. For example, the QDs may be loaded into the porous structure 120 by infiltrating a liquid (such as toluene, polydimethylsiloxane (PDMS), etc.) containing QDs into the porous structure 120 and/or the nanoporous materials. As the pores 123 are dispersed in a three-dimensional space, the QDs may be loaded into the three-dimensional space occupied by the pores 123.

The QDs may be and/or include semiconductor particles in nanoscale sizes (also referred to as "nanoparticles"). Each of the QDs may include any suitable semiconductor material that may be used to produce a QD for implementing light conversion devices in accordance with the present disclosure, such as one or more of ZnS, ZnSe, CdSe, InP, CdS, PbS, InP, InAs, GaAs, GaP, etc. Multiple QDs placed in the porous structure 120 may or may not include the same semiconductor material.

Each of the QDs may have a suitable core-shell structure that may include a core and/or one or more shells. The core and the shells may or may not include the same semiconductor material. As an example, one or more of the QDs may have a core comprising a suitable semiconductor material. As another example, one or more of the QDs may have a core comprising a first semiconductor material (e.g., CdS) and a shell comprising a second semiconductor material (e.g., ZnS). As a further example, one or more of the QDs may have a core (e.g., a CdSe core) and multiple shells (e.g., a first shell comprising ZnSe, a second shell comprising ZnS). Multiple QDs placed in the porous structure may or may not have the same core-shell structures.

When excited by electricity or light, a QD may emit light of a certain wavelength and/or a range of wavelengths (also referred to as the "emission wavelength" of the QD). More particularly, for example, the QD may absorb one or more photons with a wavelength shorter than the emission wavelength of the QD. Different QDs (e.g., QDs of various shapes, sizes, and/or materials) may emit light with various wavelengths. For example, a relatively larger QD may emit light with a relatively longer wavelength, while a relatively smaller QD may emit light with a relatively shorter wavelength.

In some embodiments, QDs of various emission wavelengths may be placed in the porous structure and/or nanoporous materials to achieve a mixed color emission. For example, as shown in FIG. 1C, the QDs placed in the porous structure 120 may include one or more QDs 131 with a first emission wavelength (also referred to as the "first QDs"), one or more QDs 133 with a second emission wavelength (also referred to as the "second QDs"), one or more QDs 135 with a third emission wavelength (also referred to as the "third QDs"), etc. QDs 131, 133, and/or 135 may have different sizes, shapes, compositions, etc. to achieve different emission wavelengths. QDs 131, 133, and/or 135 may or may not contain different materials. In one implementation, QDs 131, 133, and/or 135 contain different semiconductor materials.

When excited by light 141, the first QDs may convert light 141 to light 143 with the first emission wavelength. The second QDs may convert the light 141 to light 145 with the second emission wavelength. The third QDs may convert the light 141 to light 147 with the third emission wavelength. The light 141 may be produced by any light source that is capable of producing light. Examples of the light source may include one or more light-emitting diodes, laser diodes, etc. In some embodiments, light 141 may have a wavelength that is not longer than the first emission wavelength, the second emission wavelength, and/or the third emission wavelength. Light 143, 145, and 147 may be of different colors (e.g., red light, green light, blue light).

As shown in FIG. 1C, the first QDs, the second QDs, and the third QDs may be placed in various portions of the porous structure 120 (e.g., a first portion, a second portion, and a third portion of the porous structure 120, respectively). Each of the portions of the porous structure may include multiple layers of QDs loaded in a three-dimensional space that was formed by one or more portions of the pores 123.

In accordance with one or more aspects of the present disclosure, a light conversion device is provided. The light conversion device may include a porous structure and a plurality of QDs placed in the porous structure. The porous structure may include one or more nanoporous materials. The nanoporous materials and/or the porous structure may include a matrix structure comprising one or more semiconductor materials (Si, GaN, AlN, etc.), glass, plastic, metal, polymer, etc. The nanoporous materials and/or the porous structure may further include one or more pores and/or voids.

The plurality of QDs may include QDs of various emission wavelengths, such as one or more first QDs with a first emission wavelength (also referred to herein as the "first plurality of QDs"), one or more second QDs with a second emission wavelength (also referred to herein as the "second plurality of QDs"), one or more third QDs with a third emission wavelength (also referred to herein as the "third plurality of QDs"), etc. The first QDs, the second QDs, and the third QDs may or may not have the same size, shape, and/or material. In some embodiments, one or more of the first QDs may have a first size and/or a first shape. One or more of the second QDs may have a second size and/or a second shape. One or more of the third QDs may have a third size and/or a third shape. In one implementation, the first size may be different from the second size and/or the third size. In one implementation, the first shape may be different from the second shape and/or the third shape. In one implementation, one or more of the first QDs, the second QDs, and/or the third QDs may include different materials.

The light conversion device may convert light of a certain wavelength into light of one or more desired wavelengths (e.g., may convert light of a shorter wavelength to light of longer wavelength(s)). In some embodiments, the light conversion device may convert light of a first color into one or more of light of a second color, light of a third color, light of a fourth color, etc. The first color, the second color, the third color, the fourth color may correspond to a first wavelength, a second wavelength, a third wavelength, and a fourth wavelength, respectively. In some embodiments, the first color is different from the second color, the third color, and/or the fourth color. In some embodiments, the second color, the third color, and the fourth color may correspond to a red color, a green color, and a blue color, respectively. In some embodiments, the light of the first color comprises violet light.

Figure 2A:
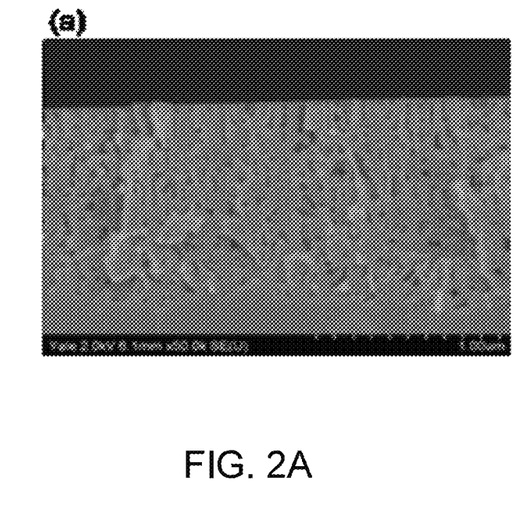
FIG. 2A is a cross-sectional Scanning Electron microscopy (SEM) image of an example light conversion device in accordance with one or more aspects of the present disclosure.

FIG. 2A is a cross-sectional SEM image of an example light conversion device in accordance with one or more aspects of the present disclosure. The light conversion device may comprise a porous structure comprising GaN (nanoporous GaN) and QDs placed in the porous structure and/or the nanoporous GaN. As illustrated, when excited by input light having a wavelength of about 420 nm, the light conversion device may convert the input light into red light.

Figure 2B:
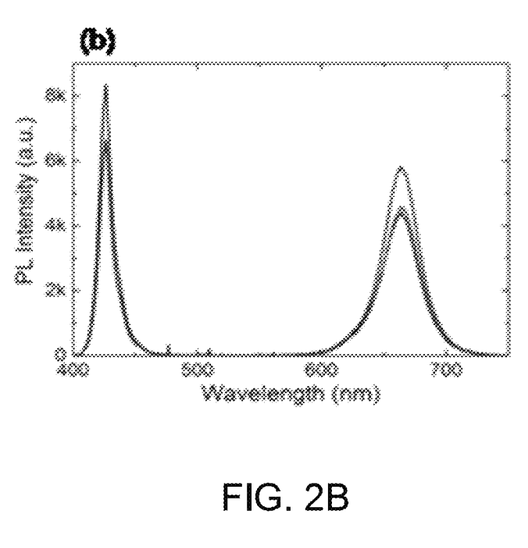
FIG. 2B depicts a photoluminescence (PL) spectrum of an example light conversion device in accordance with one or more aspects of the present disclosure.

FIG. 2B depicts a PL spectrum of an example light conversion device in accordance with one or more aspects of the present disclosure. As shown, the light conversion device can convert input light having a wavelength of about 420 nm into green light (e.g., light with an emission wavelength of 650 nm).

Figure 3:
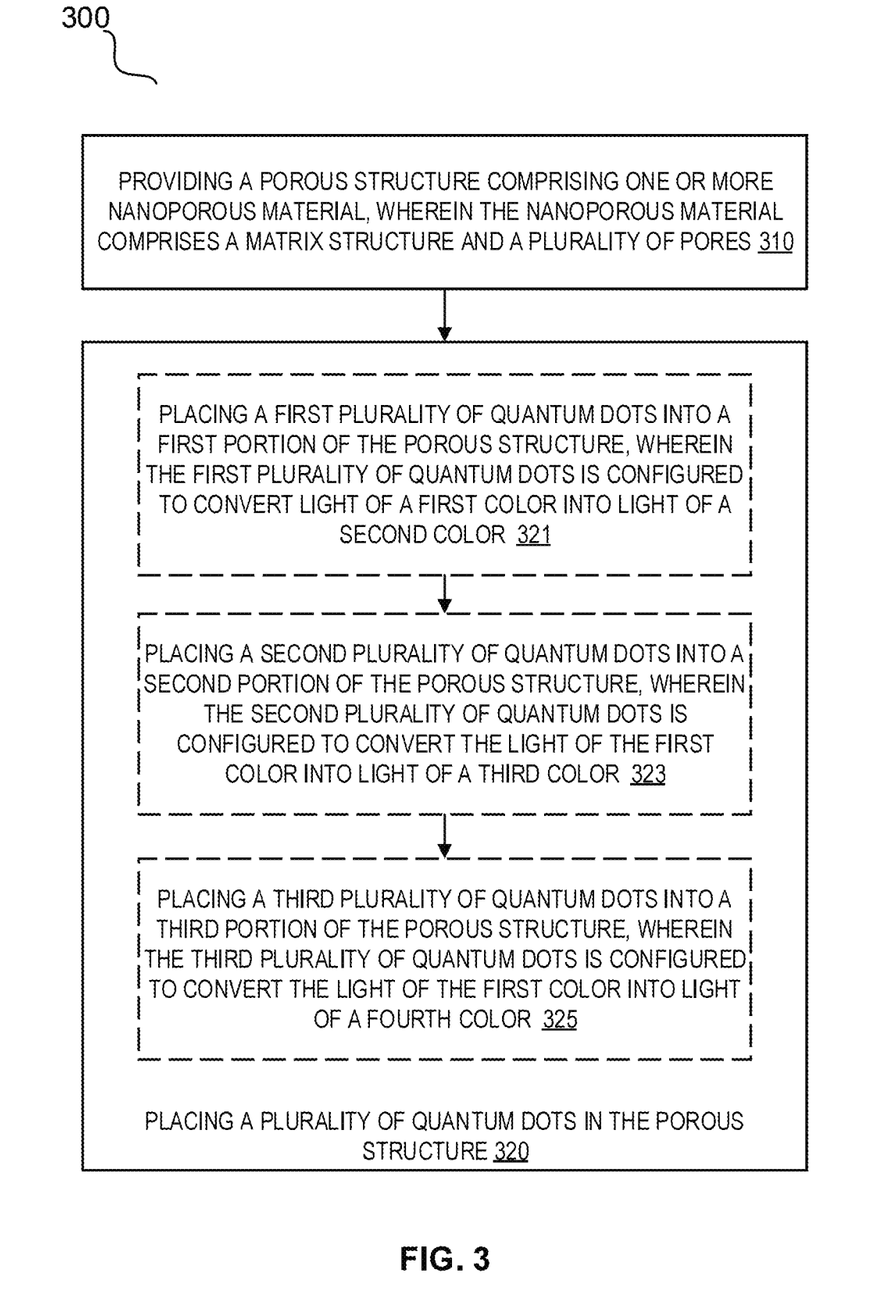
FIG. 3 is a flowchart illustrating an example of a process for fabricating a light conversion device in accordance with one or more aspects of the present disclosure.

Referring to FIG. 3, a flowchart an example 300 of a process for fabricating a light conversion device in accordance with some embodiments of the present disclosure is shown.

As illustrated, the method 300 may start at block 310 where a porous structure comprising one or more nanoporous materials is provided. The one or more nanoporous materials may include a matrix structure and a plurality of pores. Each of the pores may have a nanoscale size.

In some embodiments, providing the porous structure may include fabricating the porous structure. For example, one or more operations as described in connection with FIGS. 1A-1B above may be performed. In some embodiments, fabricating the porous structure may include forming the one or more nanoporous material using a solid material, such as a semiconductor material, glass, plastic, metal, polymer, etc. For example, the solid material may be etched to form pores of nanoscale sizes in the solid material.

At block 320, a plurality of quantum dots may be placed in the porous structure. The quantum dots may have various emission wavelengths and may convert input light into light of a mixed color emission. For example, the quantum dots may convert light of a first color into light of a second color and light of a third color. As another example, the quantum dots may also convert the light of the first color into light of a fourth color. In some embodiments, the second color, the third color, and the fourth color may include a green color, a red color, and a blue color, respectively. In some embodiments, the input light may include violet light.

In some embodiments, placing the quantum dots in the porous structure may include performing one or more operations depicted in blocks 321, 323, and/or 325. At block 321, a first plurality of quantum dots may be placed into a first portion of the porous structure (e.g., a first plurality of pores in the nanoporous materials). The first plurality of quantum dots may have a first emission wavelength and may convert input light of a first color into light of a second color. The light of the second color may have a wavelength corresponding to the first emission wavelength.

At block 323, a second plurality of quantum dots may be placed into a second portion of the porous structure (e.g., a second plurality of pores in the nanoporous materials). The second plurality of quantum dots may have a second emission wavelength and may convert the input light into light of a third color. The light of the third color may have a wavelength corresponding to the second emission wavelength.

At block 325, a third plurality of quantum dots may be placed into a third portion of the porous structure (e.g., a third plurality of pores in the nanoporous materials). The third plurality of quantum dots may have a third emission wavelength and may convert the input light into light of a fourth color. The light of the fourth color may have a wavelength corresponding to the third emission wavelength.

In accordance with one or more aspects of the present disclosure, a display for presenting media content is provided. Examples of media content may include text, audio content, video content, images, graphics, etc. The display may comprise a light conversion device as described herein. The display may be of any suitable size. The display may be incorporated into any suitable computing device, such as mobile phones, laptops, desktops, tablet computer devices, wearable computing devices (e.g., watches, eyeglasses, head-mounted displays, virtual reality headsets, activity trackers, clothing, etc.), televisions, etc. The display may be and/or include a liquid-crystal display (LCD), an organic light-emitting diode (OLED) display, an LED display, a micro-LED display, etc. In some embodiments, the display may be and/or include a flexible display and/or a foldable display.

In accordance with one or more aspects of the present disclosure, a light-emitting device is provided. The light-emitting device may comprise a light conversion device as described herein. The light-emitting device may further comprise one or more light-emitting diodes, laser diodes, and/or any other suitable device that is capable of producing light.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be appreciated that the methods disclosed in this specification are capable of being stored on an article of manufacture to facilitate transporting and transferring such methods to computing devices. The term "article of manufacture," as used herein, is intended to encompass a computer program accessible from any computer-readable device or memory page media.

The terms "approximately," "about," and "substantially" may be used to mean within ±20% of a target dimension in some embodiments, within ±10% of a target dimension in some embodiments, within ±5% of a target dimension in some embodiments, and yet within ±2% in some embodiments. The terms "approximately" and "about" may include the target dimension.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A light conversion device, comprising:
a porous structure comprising one or more nanoporous materials, wherein the one or more nanoporous materials comprise a matrix structure and a plurality of pores in the matrix structure, wherein the matrix structure comprises at least one of glass, plastic, or polymer; and
a plurality of quantum dots placed in the plurality of pores of the porous structure, wherein the plurality of quantum dots comprises a first plurality of quantum dots configured to convert light of a first color into red light and a second plurality of quantum dots configured to convert the light of the first color into green light, wherein a first portion of the porous structure comprises a plurality of layers of the first plurality of quantum dots placed in a first plurality of pores in the nanoporous materials, wherein a second portion of the porous structure comprises a plurality of layers of the second plurality of quantum dots placed in a second plurality of pores in the nanoporous materials, and wherein, when the light conversion device is excited by the light of the first color, the first portion of the porous structure, the second portion of the porous structure, and a third portion of the porous structure produces red light, green light, and blue light, respectively.

2. The light conversion device of claim 1, wherein the plurality of quantum dots is placed in the plurality of pores, and wherein each of the plurality of pores has a nanoscale size.

3. The light conversion device of claim 1, wherein the one or more nanoporous materials comprise a semiconductor material, and wherein the semiconductor material comprises at least one of Si, AlN, InGaN, or AlGaN.

4. The light conversion device of claim 1, wherein the light of the first color is produced by a light source, and wherein the light source comprises at least one of a light-emitting diode or a laser diode.

5. The light conversion device of claim 1, wherein the light of the first color comprises violet light.

6. The light conversion device of claim 1, wherein the plurality of quantum dots further comprises a third plurality of quantum dots configured to convert the light of the first color to light of a fourth color.

7. The light conversion device of claim 6, wherein the fourth color comprises a blue color.

8. A method for fabricating a light conversion device, comprising:
providing a porous structure comprising one or more nanoporous materials, comprising:
fabricating a solid material into the one or more nanoporous materials by etching the solid material to form a plurality of pores in the solid material, wherein the solid material comprises at least one of glass, plastic, or polymer; and
placing a plurality of quantum dots in the plurality of pores of the porous structure, wherein the plurality of quantum dots comprises a first plurality of quantum dots configured to convert light of a first color into light of a second color, and a second plurality of quantum dots configured to convert the light of the first color into light of a third color.

9. The method of claim 8, wherein each of the plurality of pores has a nanoscale size.

10. The method of claim 8, wherein the solid material comprises a semiconductor material, and wherein the semiconductor material comprises at least one of Si, AlN, InGaN, or AlGaN.

11. The method of claim 8, wherein the light of the first color comprises violet light.

12. The method of claim 8, wherein the plurality of quantum dots further comprises a third plurality of quantum dots configured to convert the light of the first color to light of a fourth color.

13. The method of claim 12, wherein the fourth color comprises a blue color.

14. The method of claim 12, wherein the plurality of quantum dots is placed in various portions of the porous structure, respectively, and wherein placing the plurality of quantum dots in the porous structure comprises:
placing the first plurality of quantum dots in a first portion of the porous structure;
placing the second plurality of quantum dots in a second portion of the porous structure; and
placing the third plurality of quantum dots in a third portion of the porous structure.

15. The method of claim 8, wherein the plurality of quantum dots is placed in the porous structure using at least one of a photolithography method or an inkjet printing method.

16. The method of claim 9, wherein the solid material comprises glass.

17. The method of claim 9, wherein the solid material comprises plastic.

18. The method of claim 9, wherein the solid material comprises metal.

19. The method of claim 9, wherein the solid material comprises polymer.

* * * * *